US010497593B2

(12) United States Patent
Alkire (10) Patent No.: US 10,497,593 B2
(45) Date of Patent: Dec. 3, 2019

(54) BI-METAL FOIL FOR A BEAM INTENSITY/POSITION MONITOR, METHOD FOR DETERMINING MASS ABSORPTION COEFFICIENTS

(71) Applicant: UCHICAGO ARGONNE, LLC, Chicago, IL (US)

(72) Inventor: Randy Alkire, Romeoville, IL (US)

(73) Assignee: UCHICAGO ARGONNE, LLC, Chicago, IL (US)

( * ) Notice: Subject to any disclaimer, the term of this patent is extended or adjusted under 35 U.S.C. 154(b) by 286 days.

(21) Appl. No.: 15/680,954

(22) Filed: Aug. 18, 2017

(65) Prior Publication Data

US 2019/0057888 A1    Feb. 21, 2019

(51) Int. Cl.
| | |
|---|---|
| *H01L 21/67* | (2006.01) |
| *H01L 31/0336* | (2006.01) |
| *H01J 37/30* | (2006.01) |
| *H01L 31/16* | (2006.01) |
| *H01J 37/317* | (2006.01) |

(Continued)

(52) U.S. Cl.
CPC ...... *H01L 21/67253* (2013.01); *G01J 1/0204* (2013.01); *G03F 7/2008* (2013.01); *H01J 37/3005* (2013.01); *H01J 37/3174* (2013.01); *H01L 31/02* (2013.01); *H01L 31/03365* (2013.01); *H01L 31/16* (2013.01)

(58) Field of Classification Search
CPC ............... H01L 21/67253; H01L 31/02; H01L 31/03365; H01L 31/16; G01J 1/0204; G03F 7/2008; H01J 37/3005; H01J 37/3174

USPC ........................................................ 378/53, 54
See application file for complete search history.

(56) References Cited

U.S. PATENT DOCUMENTS 2,947,871 A * 8/1960 Friedman ............... G01N 23/16
378/53
4,037,104 A * 7/1977 Allport ................. G01B 15/025
378/56

(Continued)

OTHER PUBLICATIONS

R.W. Alkire et al. Development of a real-time timing-shutter performance monitor for protein crystallography, Journal of Synchotron Radiation, 13, 2006, pp. 408-410.

*Primary Examiner* — Courtney D Thomas
(74) *Attorney, Agent, or Firm* — Cherskov Flaynik & Gurda, LLC (57) ABSTRACT

The invention provides a beam intensity/positioning monitor substrate comprising a first metal foil in physical contact with a second metal foil. Also provided is a method for determining mass absorption coefficients, the method comprising measuring the absorption of an incident radiation beam by a first metal and a second metal comprising a bi-metal foil as a function of a first energy and a second energy; calculating the relative first metal thickness; using the relative thickness as a target value for the first metal fitting procedure; repeat the above steps on a free standing first metal foil; using the free standing first metal absorption measurements, bulk first metal density and first (bimetal) fit coefficients to determine first metal foil thickness; using free standing first metal to conduct a high resolution scan from just below its absorption edge to 1 keV or higher in energy; and using the free standing first metal absorption measurements below the absorption edge and experimentally determined thickness to compute mass absorption coefficients below its absorption edge.

9 Claims, 5 Drawing Sheets

(51) Int. Cl.
*G03F 7/20* (2006.01)
*G01J 1/02* (2006.01)
*H01L 31/02* (2006.01)

(56) References Cited

U.S. PATENT DOCUMENTS

| | | |
|---|---|---|
| 6,596,994 B1 | 7/2003 | Alkire et al. |
| 7,162,888 B2 | 1/2007 | Shu et al. |
| 9,140,930 B2 | 5/2015 | Kyele et al. |

* cited by examiner

BI-METAL FOIL FOR A BEAM INTENSITY/POSITION MONITOR, METHOD FOR DETERMINING MASS ABSORPTION COEFFICIENTS

CONTRACTUAL ORIGIN OF THE INVENTION

The U.S. Government has rights in this invention pursuant to Contract No. DE-AC02-06CH11357 between the U.S. Department of Energy and UChicago Argonne, LLC, representing Argonne National Laboratory.

BACKGROUND OF THE INVENTION

1. Field of the Invention

This invention relates to synchrotron beamline diagnostics and measuring mass absorption cross sections. More specifically, this invention relates to beam position monitors for measuring the position of X-ray beams, beam intensity monitors for tracking beam source intensity, energy calibration reference markers and to the determination of mass absorption cross sections using an invented bi-metal foil.

2. Background of the Invention

X-rays can be classified as short-wave electromagnetic radiation. They can be produced in parcels of energy called photons. The absorption of X-ray photons by any material depends upon both the structure and elemental composition of the material under study. The primary interactions of photons with atoms are photoabsorption and coherent (elastic) scattering. Inelastic (Compton) scattering becomes dominant for all elements as the higher γ-ray energies are approached. Photons can interact with atoms at a myriad of energy ranges. In the intermediate energy range, typically from 0.01 keV to 0.1 keV through to 80 keV to 800 keV, the interaction of the incident photon with the electrons—i.e., with the bound atomic orbitals—without production of secondary x rays of reduced energy, is the dominant process. The photon is then either scattered without altering the internal energy of the atom, or it is fully absorbed. This absorption is usually into a single atomic orbital, with a consequent ejection of a photoelectron and production of a singly-ionized species.

Diffraction from a three-dimensional periodic structure such as atoms in a crystal is called Bragg diffraction. It is similar to what occurs when waves are scattered from a diffraction grating. Bragg diffraction is a consequence of interference between waves reflecting from different crystal planes. The condition of constructive interference is given by Bragg's law, to wit:

$$m\lambda = 2d \sin \theta$$

wherein $\lambda$ is the wavelength, d is the distance between crystal planes, $\theta$ is the angle of the diffracted wave, and m is an integer known as the order of the diffracted beam.

Bragg diffraction may be carried out using either light of very short wavelength like X-rays or matter waves like neutrons (and electrons) whose wavelength is on the order of (or much smaller than) the atomic spacing.—The pattern produced gives information of the separations of crystallographic planes d, allowing one to deduce the crystal structure.

The number of materials for which photon cross sections are needed is large and ever increasing. Available tables usually include cross sections for many elements. However, it is not possible to meet all cross-section requirements by means of printed tables. Moreover, the cross sections are often needed at photon energies other than those included in existing tables. For example, photoabsorption cross sections and total attenuation coefficients are discontinuous at absorption edges, e.g, K, L and M. There is a large body of work related to absorption cross sections, including that available at the National Institutes of Standards and Technology (NIST), specifically at J. Phys. Chem. Ref. Data 29(4) 597-1048 (2000), the entirety of which is incorporated by reference.

A vital component of any X-ray beamline is the diagnostic device that allows various properties of the X-ray beam to be measured.

A typical machine may use many different types of measurement devices in order to measure different properties. These include (but are not limited to) Beam Position Monitors (BPMs) to measure the position of the X-rays, screens (fluorescent screens, Optical Transition Radiation (OTR) devices) to image the profile of the X-rays, and wire-scanners to measure its cross-section.

When operating a synchrotron beamline, the beam on the sample must be stable and its intensity well characterized beyond the beam defining slits. The inventor was involved in designing a beam position monitor in the late 1990's that incorporated a metal foil which generated fluorescence into a photodiode array. (R. W. Alkire, G. Rosenbaum and G. Evans, J. Synchrotron Rad. Vol. 7, pp. 61-68 (2000). Characteristics of this device depend upon the choice and properties of the metal foil.

When materials are exposed to short-wavelength X-rays or to gamma rays, ionization of their component atoms may take place. Ionization consists of the ejection of one or more electrons from the atom, and may occur if the atom is exposed to radiation with an energy greater than its ionization energy. X-rays and gamma rays can be energetic enough to expel tightly held electrons from the inner orbitals of the atom. The removal of an electron in this way makes the electronic structure of the atom unstable, and electrons in higher orbitals "fall" into the lower orbital to fill the hole left behind. In falling, energy is released in the form of a photon, the energy of which is equal to the energy difference of the two orbitals involved. Thus, the material emits radiation, which has energy characteristics of the atoms present.

In physics, the most common orbital descriptions are based on the solutions to the hydrogen atom, where orbitals are given by the product between a radial function and a pure spherical harmonic. The quantum numbers, together with the rules governing their possible values, are as follows:

The principal quantum number n describes the energy of the electron and is always a positive integer. Each atom has, in general, many orbitals associated with each value of n; these orbitals together are sometimes called electron shells.

The azimuthal quantum number l describes the orbital angular momentum of each electron and is a non-negative integer. Within a shell where n is some integer n0, l ranges across all (integer) values satisfying the relation $0 \leq l \leq n_0 - 1$. For instance, the n=1 shell has only orbitals with l=0 and the n=2 shell has only orbitals with l=0 and l=1. The set of orbitals associated with a particular value of l are sometimes collectively called a subshell.

The magnetic quantum number, $m_l$, describes the magnetic moment of an electron in an arbitrary direction, and is also always an integer. Within a subshell where l is some integer $l_0$, ml ranges thus: $-l_0 \leq m_l \leq l_0$.

Each electron also has a spin quantum number, s, which describes the spin of each electron (spin up or spin down). The number s can be +½ or −½.

The Pauli exclusion principle states that no two electrons in an atom can have the same values of all four quantum numbers. If there are two electrons in an orbital with given values for three quantum numbers, (n, l, m), these two electrons must differ in their spin.

The term fluorescence is applied to phenomena in which the absorption of radiation of a specific energy results in the re-emission of radiation of a different energy (generally lower). Each element has electronic orbitals (e.g., 1 s, 2 s, 3 s) of characteristic energy. The 1 s electronic orbital contains the least energetic electron and is designated as the K energy level. The 2 s electronic orbital (principal quantum number=2) contains an energy level higher than the first shell based on the higher principal quantum number; this range is designated as the L shell. As the principal quantum number increases e.g., n=3 (M shell), the energy levels increase.

Following removal of an inner electron by an energetic photon provided by a primary radiation source, an electron from an outer shell drops into its place. There are a limited number of ways in which this can happen. The main transitions are given names: an L→K transition is traditionally called $K_\alpha$, an M→K transition is called $K_\beta$, an M→L transition is called $L_\beta$, and so on. Each of these transitions yields a fluorescent photon with a characteristic energy equal to the difference in energy of the initial and final orbital.

"Absorption edge" is another way of referring to the ionization energy required to remove an electron from an inner atomic shell. Cr metal foil is the most widely used foil for protein crystallography due to its relatively low energy absorption K-edge (L→K transition, 5989 eV) and its ability to maintain a sufficiently high absorption cross section above the K-edge out to at least 20 keV. The Au L3-edge at 11919 eV is useful for very high-energy applications. In addition, the emission energy of Au (9713 eV) is quite large, allowing more current to be generated by the photodiode due to the high energy fluorescent photons.

Typically, the energy range of interest at bending magnet beamlines is between about 6 and 13.5 keV. The energy range is well suited to the characteristics of a Cr fluorescing metal foil (Cr K-edge 5989 eV, and emission energy of 5415 eV). However, many crystallographic structural studies embodying Single-wavelength Anomalous Diffraction (SAD) techniques employ lower energy X rays. For example, measurements of the sulfur anomalous signal may occur at energies lower than 6 keV. Conversely, high resolutions studies require higher energies (e.g, above 25 keV).

To expand the low energy range and increase the signal at higher energy, the foil needs to have a lower energy absorption edge than Cr but at the same time a higher emission energy to boost signal.

Many beam lines have only a single foil holder. As such, users would need to manually change foils to accommodate different energy ranges. Either that, or an in situ dual foil mechanism would have to be installed, wherein a mechanical device switches one separate foil for another separate foil, upon a remote command by the operator. Since these beamlines are operating in-vacuum, manual switching of foils would be very time consuming. In addition, the foils are quite fragile and can easily break with poor handling or during vacuum pump-down procedures.

A need exists in the art for a beam position monitor foil that operates below 6 keV and above 25 keV, so as to eliminate the need to change the metal foil out of a beamline. The foil should be relatively simple in design. The foil should confer dual metal capability while remaining stationary.

SUMMARY OF INVENTION

An object of the invention is to provide a beam position monitor substrate that overcomes many of the drawbacks of the prior art.

Another object of the invention is to provide a beam position monitor substrate that can be used over a wide range of energies. A feature of the invention is that it comprises a bi-metal component of two different metals. An advantage of the invention is that it increases the operating range of a fluorescing metal-foil based beam position monitor by providing characteristics of two metals within a single foil. For example, an invented bi-metal foil operates below 6 keV and above 25 keV. As such, foil handling in and out of a beamline is all but eliminated except for the initial installation of the foil into the beam line.

Still another object of the present invention is to provide a beam intensity monitor that can be used over a wide range of energies. A feature of the invention is that it comprises a bi-metal substrate made of two different metal foils laminated to each other, with a first metal foil situated downstream of a second metal foil. An advantage of the invention is that due to the specific absorption characteristics of the first and second metals, the bimetal foil can be used as an energy calibration device relative to the absorption edges or each metal. This can be done by monitoring one or more photodiode signals or by monitoring the summation of all photodiode signals without need to determine beam position.

Yet another object of the invention is to provide a method for measuring the absorption cross sections of a first metal foil. A feature of the invention is the use of a transference technique whereby the approximate cross sections are estimated based on the absorption exhibited by the bi-metal foil, as a function of energy. Then, the estimated cross sections are combined with a standalone first metal foil to determine absolute cross section values. An advantage of the invention is that the method has errors at about the 1 percent level compared to 10-50 percent errors in state of the art protocols.

Briefly, the invention provides a beam positioning monitor substrate comprising a first metal foil in physical contact with a second metal foil.

Also provided is a method for determining mass absorption coefficients, the method comprising measuring the absorption of an incident radiation beam by a first metal and a second metal comprising a bi-metal foil as a function of a first energy and a second energy. (The absorption by the bimetal foil requires two measurements at each energy (one with the foil in and one with the foil out, which generates a single absorption value for each energy. As such, the utilization of two energies generates two values.)

Then, the relative first metal thickness is calculated. Optionally, the thicknesses of both the first and second metals comprising the bimetal foil can be calculated, but only one is needed to conduct the fitting, as discussed immediately below.

The calculated relative thickness of the first metal foil is used as a target value to fit the mass absorption coefficients for first metal foil based on absorption measurements performed at multiple energies across the first metal foil's absorption edge boundary.

The above steps are then conducted on a free standing first metal foil which is positioned downstream of the upstream bi-metal foil. For example, the single metal foil may be located at the "Sample" location shown in FIG. 1A. (The sample is mounted to a translation device allowing it to be moved in and out of the beam 11 for measurement.) The BPM-2, 18, and an ion chamber located downstream of the Sample position, mounted underneath the detector and raised to intercept the main beam, are used to perform the free standing metal foil absorption measurements in this general configuration. While the ion chamber is of particular value, other detector combinations could be used as long as the absorption measurement allows an incident (Izero) reference intensity detector (BPM-2 in this instance) and a transmission (I) detector (ion chamber as described) so that the sample can be moved in and out of the beam between the measurements.

The free standing first metal absorption measurements are used, along with the bulk first metal density and first (bimetal) fit coefficients to determine the free standing single metal foil thickness. Then, the free standing single metal foil is used to conduct a high resolution scan from 0.10-0.20 keV below its K-edge to 0.8 or more keV above the absorption edge.

Finally, the free standing metal foil absorption measurements at energy below the absorption edge are used along with the predetermined free standing metal foil thickness to compute mass absorption coefficients below its K-edge. The K-edge is meant to be representative, not exclusive, as an L-edge might also be investigated.

The bi-metal foil is comprised of a first metal and a second metal and the step of calculating the thickness for each metal comprises measuring absorption of the bi-metal foil at multiple energies wherein the energy range is determined so that measurements relative to the first metal foil will span above and below an absorption edge boundary, determining the component thickness of each bi-metal foil using the relative bi-metal foil densities of each component and known National Institute of Standards and Technology (NIST) mass absorption cross sections with errors at the 1 percent level for the first and second foils within these ranges; and using the relative bi-metal component thicknesses and NIST 1 percent error coefficients for the second metal component to fit the mass absorption coefficients for the first metal foil at all measured energies above the absorption edge.

In summary of the invented method, the bimetal foil measurements and fitting procedure are used to fit the absorption coefficients for the bimetal first metal (Ni in this experiment) at each measurement energy. With the fit coefficients determined, a free standing metal foil of known density is then used to remake absorption measurements at the same energies used in the fitting procedure because that is where the coefficients have been determined. With the fit coefficients already determined, the thickness of the free standing-metal foil can be determined from the measurements using the Beer Lambert formula. When utilizing the invented bimetal substrate, the absorption of an incident radiation beam by its first downstream positioned metal and its second upstream second metal is calculated via the Beer-Lambert Law. Once the free standing-metal thickness is calculated, any absorption measurements made at any energy using the free standing-metal foil can be put on an absolute scale.

Additional description for the invented method can be found in the journal article: R. W. Alkire, "Approximating the near-edge mass absorption coefficients for Ni using an ultra-thin bi-metal foil." Vol 50, Pages 1-13 *J. Appl. Crystallography* (2017), the entirety of which is incorporated by reference.

BRIEF DESCRIPTION OF DRAWING

The invention together with the above and other objects and advantages will be best understood from the following detailed description of the preferred embodiment of the invention shown in the accompanying drawings, wherein.

DETAILED DESCRIPTION OF THE INVENTION

The foregoing summary, as well as the following detailed description of certain embodiments of the present invention, will be better understood when read in conjunction with the appended drawings.

All numeric values are herein assumed to be modified by the term "about", whether or not explicitly indicated. The term "about" generally refers to a range of numbers that one of skill in the art would consider equivalent to the recited value (e.g., having the same function or result). In many instances, the terms "about" may include numbers that are rounded to the nearest significant figure.

The recitation of numerical ranges by endpoints includes all numbers within that range (e.g. 1 to 5 includes 1, 1.5, 2, 2.75, 3, 3.80, 4, and 5).

The following detailed description should be read with reference to the drawings in which similar elements in different drawings are numbered the same. The drawings, which are not necessarily to scale, depict illustrative embodiments and are not intended to limit the scope of the invention.

As used herein, an element or step recited in the singular and preceded with the word "a" or "an" should be understood as not excluding plural said elements or steps, unless such exclusion is explicitly stated. As used in this specification and the appended claims, the term "or" is generally employed in its sense including "and/or" unless the content clearly dictates otherwise.

Furthermore, references to "one embodiment" of the present invention are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

This invention comprises a new bi-metal foil that increases the operating range of a fluorescing metal-foil based beam position monitor (BPM) by providing characteristics of two metals within a single foil. The bi-metal foil eliminates the need to move or substitute the foil to so as to accommodate a wide range of energy values. Rather, the invented foil remains stationary during the entire beam positioning monitoring procedure.

The bi-metal foil used in the BPM may also be used as an intensity monitor by monitoring one or more photodiode signals or by monitoring the summation of all photodiode signals without need to determine beam position.

BPM ranges are determined by metal absorption (edges) and mass absorption cross sections as a function of energy. Mass absorption cross sections vary depending on where on the atom's absorption spectrum incoming photons interact. For example, just above the absorption edge energy, the influence of a neighboring atom increases. Conversely, regions further from an energy edge value are subjected to less influence of a neighboring atom.

The bi-metal foil may be used as an energy calibration device according to the characteristic absorption edges present in the bi-metal foil. Any of the edges present in either first or second metal may act as a calibration reference based on the metal's absorption edge energy.

An invented bi-metal foil provides an increased operating range as a beam position monitor. The dual foil invention could be used in any fluorescent foil based beam position monitor. A myriad of metal foil combinations are envisioned, including Ti—Ni, Ti—Co, Ti—Cu, Ti—Pt, Ti—Au, Cr—Co, Cr—Cu, Cr—Pt, Cr—Au, and combinations thereof.

The dual foil feature of the invention increases the operating low-energy range of the beam position monitor while simultaneously producing more signal intensity at the high-energy range. The dual expansion of the energy range (both at the low end and at the high end) increases the potential operational range of the beam position monitor without having to change foils to accommodate wide energy swings. In addition, the change in beam position intensity allows for a lower amplifier gain setting to be used with the photodiodes, thereby increasing the signal-to-noise and reducing the need for high gain electrometers (e.g., 10e10 or higher).

The invented device can be utilized to measure the approximate absorption cross sections for a target metal using a transference technique. In this technique, the approximate cross sections are estimated based on the absorption of a bi-metal foil (containing the target metal) as a function of energy. These estimated cross sections are then combined with a thin standalone target metal foil to determine absolute cross section values. Compared with previous measurements in the literature, the method has errors at about the one percent level.

During the course of characterizing the invented bi-metal foil disclosed herein, the thickness of each portion of the bi-metal foil should be known. To determine the relative thickness of each metal component, the mass absorption coefficients for both metals for the energy range of interest are taken from existing NIST databases, where those coefficients have errors at the 1 percent level. These 1 percent error level energies are at or below the energy range of $E/E_{edge}$ equal to less than 1.0 and $E/E_{edge}$ greater than 1.20. This restricts the measurement ranges away from the absorption edge for the thickness determination.

With known absorption coefficients, the experimental determination of the thickness of a single element foil can be made using the Beer-Lambert law, to wit:

$$(I/I_0)_E = \exp^{-[(\mu/\rho)_E \rho t]} \quad \text{Equation 1}$$

where $I_0$ is the incident intensity, I the transmitted intensity, $(\mu/\rho)_E$ the mass absorption coefficient (cm²/g) at a specific energy E, ρ the material density (g/cm³) and t the material thickness (cm). For a bimetal foil, where each foil layer is essentially independent of the other, a second term is added to the exponent to account for the second metal foil.

Once the second term is added to the exponent, however, there is no way to determine the thickness of either foil from a single measurement. To determine foil thickness, a second measurement is obtained at a different energy. With two equations, one at each energy, a solution can be found for the Ni metal foil thickness as a function of the Ti—Ni absorption and individual elemental absorption coefficients. This equation is shown below as Equation 2.

$$t_{Ni} = \frac{\left[\left(\ln\left(\frac{I}{I_0}\right)_{E_1}\left(\frac{\mu}{\rho}\right)_{TiE_2}\right) - \left(\ln\left(\frac{I}{I_0}\right)_{E_2}\left(\frac{\mu}{\rho}\right)_{TiE_1}\right)\right]}{\rho_{Ni}\left[\left(\left(\frac{\mu}{\rho}\right)_{NiE_2}\left(\frac{\mu}{\rho}\right)_{TiE_1}\right) - \left(\left(\frac{\mu}{\rho}\right)_{NiE_1}\left(\frac{\mu}{\rho}\right)_{TiE_2}\right)\right]} \quad \text{Equation 2}$$

where E1 and E2 refer to the measurement energies and $\rho_{Ni}$ refers to the density of the ultra-thin Ni foil. Once the absorption measurements are made, the principal unknowns are the mass absorption coefficients of both elements and the density of the Ni foil. Because the density of an ultra-thin metal foil is not known exactly, this thickness is said to be relative, rather than absolute. Once the Ni foil thickness has been calculated, it can be used to calculate the Ti foil thickness using the initial starting measurement and the appropriate mass absorption cross sections and densities, as utilized in Equation 3, infra:

$$t_{Ti} = \frac{-\ln\left(\frac{I}{I_0}\right)_{E_1} - \left(\frac{\mu}{\rho}\right)_{NiE_1}\rho_{Ni}t_{Ni}}{\left(\frac{\mu}{\rho}\right)_{TiE_1}\rho_{Ti}} \quad \text{Equation 3}$$

Because the absorption edge energies are known, the bimetal foil can also be used as an energy calibration device by monitoring the beamline energy relative to the characteristic absorption. Each first and second metal will provide calibration points relative to their absorption edges e.g., K, L1, L2, L3 etc.

Figure 1A:
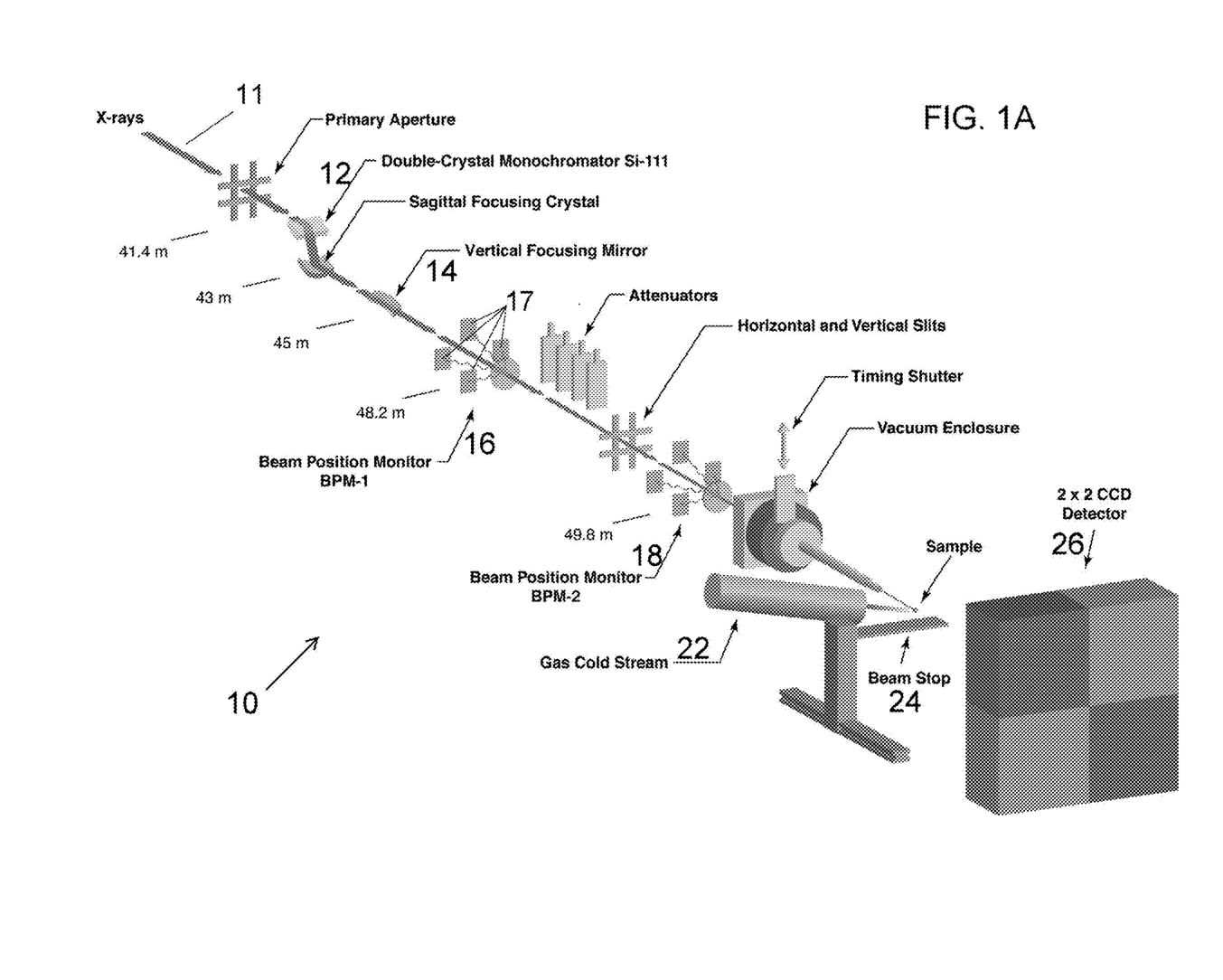
FIG. 1A depicts a beamline incorporating the invented beam positioning monitor foil.

FIG. 1A is a schematic diagram of a beamline (designated as numeral 10) used at the Advanced Photon Source at Argonne National Laboratory, Lemont Ill. The beamline comprises X-rays 11. Optics include a Si(111) double-crystal monochromator 12 with a horizontal focusing second crystal. An ultra-low expansion glass (ULE) vertical focusing mirror 14 with Pt and Pd coatings in addition to an uncoated lane is used to select different harmonic rejection characteristics.

A first beam position monitor 16 contains the invented ultra-thin bi-metal (e.g., Ti—Ni) foil, which can be moved in and out of the beam path via a pneumatic actuator. The foil is positioned downstream of photodiodes 17 to avoid powder diffraction lines from the foil that could interfere with measured fluorescence intensity. In this example, four photodiodes, symmetrically positioned and generally coplanar with each other, are utilized.

Figure 1B:
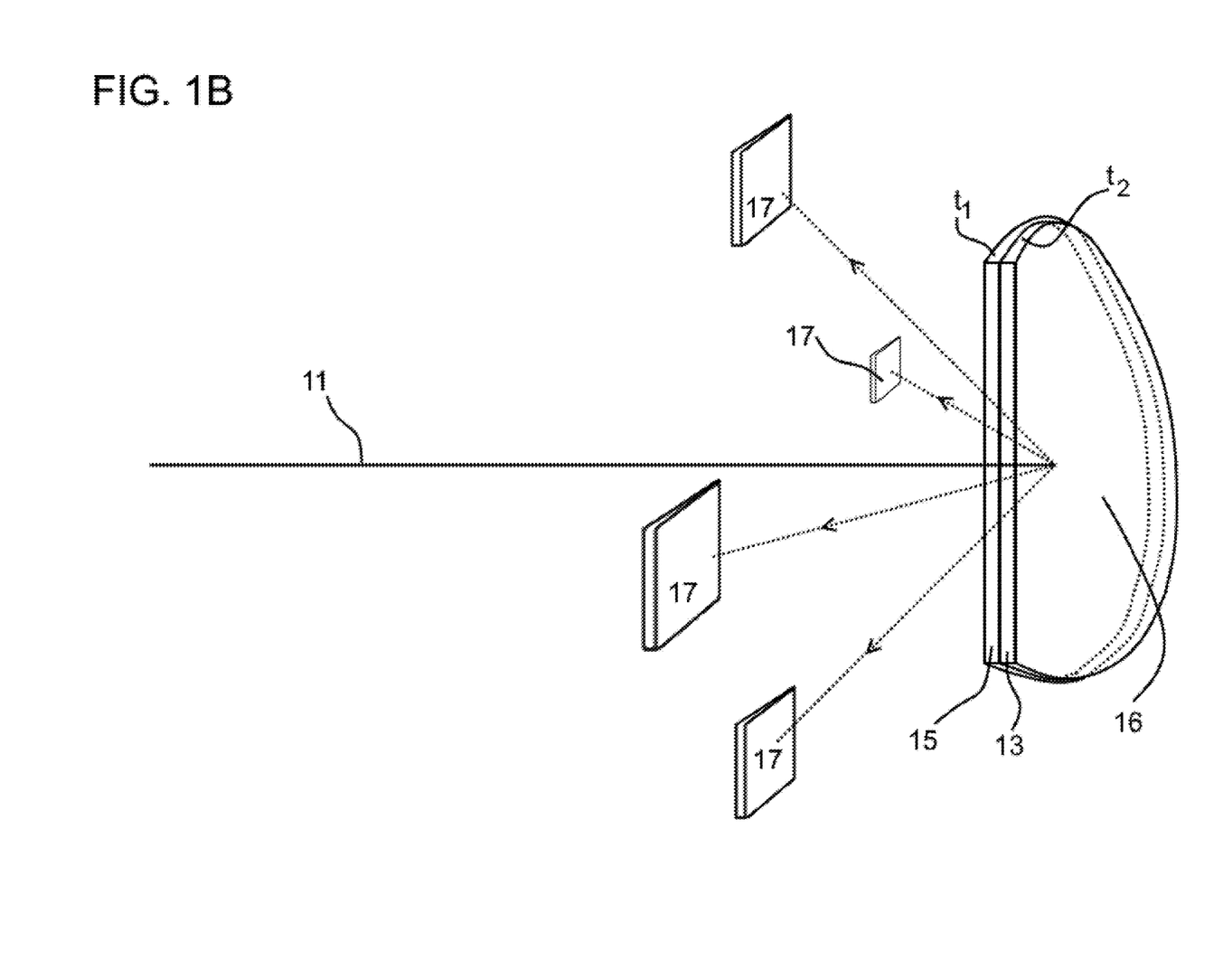
FIG. 1B is an expanded view of a bi-metal foil substrate, in accordance with feature of the present invention.

FIG. 1B is a detailed view of the bi-metal foil juxtaposed to the photodiodes. All photodiodes typically have the same dimensions and are located at 90 degree intervals from each other, so as to intercept fluorescent X-rays at the same radial distant from the bimetal foil, or be aligned so that the plane defined by the four diodes is approximately perpendicular to the incoming X-ray beam. The two larger diodes depicted in the figure represent the top and bottom photodiodes; the inboard and outboard diodes are shown smaller in size for illustration purposes only.

Using a four diode array and standard difference over the sum techniques, the X-ray beam position can be determined in both the horizontal and vertical directions. When summing all four photodiode signals, the device can be used as an intensity monitor. While the four diode array is standard, more or fewer diodes (such as 2, 5, 6, 7 or 8 diodes, etc., with an even number preferred), other types and/or combinations of detectors can be used to achieve beam position measurement. Beam intensity monitoring is also achieved by monitoring one or more detectors in the device or summing all the detectors simultaneously to achieve an overall signal average.

A first metal 13 of the bi-metal foil is positioned downstream of a second metal 15 of the bi-metal foil. The first metal incorporates a metal 13 having a larger absorption cross section at high energy compared to the second metal 15. The ratio thickness $t_1$ of the first foil to the second metal foil $t_2$ is between about 0.2:1 and about 10:1 (particularly to allow for high energy operation where the first foil should be larger than the second foil), and preferably between about 0.2:1 and about 2:1.

The thicknesses of the first and second metals may independently range from approximately 0.2-8 microns each (preferably 0.2 to 2.5 microns each), with the total thickness of the bimetal foil ranging from approximately 0.4-10 microns (and preferably 0.4 to 5 microns). The thicker profiles may be required during high energy operations. The horizontal (X) and vertical (Y) measurements of the bi-metal foil may be unrestricted so that X and Y may be of any value. This may be of value inasmuch as the width of a monochromatic beam can be very large horizontally on a bending magnet beam line.

The first metal 13 may be a $1^{st}$ or $2^{nd}$ row transition metal group of the Periodic Table, selected from the group; consisting of Ni, Co, Cu, Zn, Mo, Rh, Pd, Ag, and combinations thereof. The second metal 15 may be a $1^{st}$ or $2^{nd}$ row transition metals group of the Periodic Table, selected from the group consisting of Ti, Cr, Fe, Co, Ni Cu, Zn, Mo, Rh, Pd, Ag and combinations thereof. The first foil may also be a 3rd row transition metal group of the Periodic Table selected from the group consisting of Ta, W, Ir, Pt, Au, and combinations thereof.

A second beam position monitor 18 is mounted to an X-Y stage (not shown), allowing independent positioning of that second monitor. This second beam position monitor 18 contains an ultra-thin (e.g., approximately 0.5 µm-thick) Cr foil. After removing the cold-stream 22 and beam stop 24, an ion chamber, mounted beneath the CCD detector 26, is moved into place for the fs-Ni experiments.

Foil Fabrication Detail

The Ti—Ni foil was made by electron beam physical vapor deposition. A myriad of commercial establishments have this capability, including Lebow Company (Goleta Calif., USA). First, the Ni layer is deposited onto glass, followed by Ti. Once completed, the foil is removed and mounted to a ring structure that can be installed into a synchrotron X-ray beamline. While ultra-thin foils are sensitive to air pressure and handling, they can be installed quite easily manually. To avoid foil rupture due to excessive differential pressure during pump-down in the beamline, a slow evacuation pump-down procedure was followed with the aid of multiple pressure gauges.

Due to the low emission energy of Ti (4510 eV), the uncovered Ti side faces upstream, i.e., toward the incoming X-ray beam, approximately 10 mm from the photodiodes. The uncovered Ni side faces downstream, away from the photodiodes. The downstream positioning of the Ni foil is facilitated by the Ni emission energy being relatively higher (7478 eV), therefore allowing Ni fluorescence to easily penetrate the upstream Ti foil thickness and pass through to the photodiodes. In a device of this type it is preferable to have the foil positioned downstream of the photodiodes to avoid possible interference from powder diffraction off the foil.

Radiation Detail

The invented device and method is applicable to a variety of radiation types. Synchrotrons produce a broad spectrum of X-rays. The energy range is probably more relevant since X-rays can technically be produced at very low energy. Based on the selection of elements comprising the bi-metallic foil described herein, the lower limit of useable edges is approximately 2 keV.

X-rays are also produced by "home" sources i.e., X-ray machines sold by commercial vendors such as Bruker where an electron gun is used to generate X-rays by accelerating electrons into a water cooled target, such as copper or molybdenum.

Separately, it is possible that a bimetal foil could be used as a monitoring device in such an environment.

With multiple X-ray tubes that each produce a different wavelength X-ray, a bimetal foil could prove useful if an accurate intensity monitor is needed at different wavelengths.

Synchrotrons and home devices are the two most abundant sources of X-rays. Bimetal foil may be used at very high X-ray energies. The K edge for gold is at 80.7 keV and so the possibility exists to monitor beam intensity as high as 90-100 keV using the gold K edge.

In light of the foregoing the bimetal foil could be used from about 2 keV to about 100 keV, depending upon the choice of foil elements and the bimetal thickness.

Example

All measurements were conducted at the Structural Biology Center, bending beamline, 19BM, at the Advanced Photon Source at Argonne Laboratory, Lemont, Ill. Turning to FIG. 1A, the 19BM optics include a Si(111) double-crystal monochromator, a water cooled first crystal with liquid gallium interface, sagittal focusing second crystal web: 25 mm×75 mm×0.58 mm (width×length×thickness), and vertical focusing ultra low expansion glass mirror with Pd, Pt and glass lanes.

Downstream of the mirror is the first beam position monitor, BPM-1, which containing the above-described Ti—Ni bi-metal foil. A pneumatic plunger allows the foil holder to move completely out of the beam path. A second beam position monitor, BPM-2, is a fixed (non-movable) foil position containing a nominal 0.5 µm-Cr foil made by Arizona Carbon Foil Co. (2239-T E. Kleindale Rd, Tucson Ariz. 85719, USA). Separation distance between BPM-1 and BPM-2 is 1.6 m. All photodiodes are operated in the unbiased, photovoltaic mode. The vacuum enclosure terminates just upstream of the timing shutter via a 50 µm-thick Be window. Downstream of the timing shutter is a He filled nozzle that acts as a scatter guard. The circular opening at the end of the nozzle is nominally 0.65-mm. To ensure there is no backscatter into BPM-2 from the Pt—Ir timing shutter blade or any material downstream of the nozzle, a collimating tube has been placed just upstream of the timing shutter, preventing any unwanted radiation from passing through to the BPM-2 photodiodes. Addition description of this portion of a beamline can be found at R. W. Alkire, Michael Molitsky, F. J. Rotella, N. E. C. Duke, Patrick M. De Lurgio, John Lee and Tim Madden, J. Synchrotron Rad. 13, pp. 408-410 (2006), the entirety of which is incorporated by reference.

An on-axis camera viewing system (not shown) is present downstream of the nozzle to visually examine small proteins at the sample position. Three cameras were positioned around the sample position. One view provides a high-resolution image along the incident beam direction, perpendicular to the rotation axis, while a second high-resolution view is vertically offset 90 degrees to the first. A third camera, mounted at a 37 degree angle up from the incident beam, provides a low resolution image 7.4×5.0 mm wide (H×V). Cameras are mounted to the goniometer support stage, with all crosshairs fixed on the rotation-axis center. When the phosphor images the beam, the goniometer support stage will be moved to put the beam onto the rotation center as imaged by the cameras. In this way, reproducibility of the sample to the beam will be maintained within a few microns.

Downstream of the sample is a CCD detector used for protein crystallography. This detector is mounted to an a-frame that allows the detector to be moved with Y-Z-$\vartheta$ motions. Beneath the CCD detector is a permanently mounted ion chamber. To swing it into position requires only the beam stop to be moved and the detector vertically elevated.

The double-crystal monochromator used at 19BM has a flat Si(111) first crystal mounted to a water cooled copper block. The water-cooled block was thermally stabilized to 36° C. in order to maintain a liquid gallium interface between the copper block and the flat crystal.

The second crystal is a sagittally bent, un-ribbed crystal. Because the focussing crystal is part of the stage that rotates during energy change, the beam focus will change with energy. In protein crystallography, the energy changes required are small, typically 60 eV or less. When making a large energy change, the second crystal is refocused to maintain the optimal beam size on the sample. The second crystal has independent adjustments that allow for focus, tune and twist. Focus, tune and twist functions were performed manually via optical examination at each energy setting, using a CdWO4 crystal at the sample position to transform the X-ray beam to visible light.

Under normal conditions the horizontal beam at 19BM has a demagnification ratio of 6:1 (9:1 vertical). Beam size at the monochromator is 16×2.5 mm (H×V), with a minimum measured focus (full width at half-maximum, FWHM) at the sample position of 0.045×0.028 mm (H×V). Typical photon flux at the sample position is $1.7\times10^{11}$ ph/sec at 12.66 keV, with nominal energy resolution ($\Delta E/E$) of $3.9\times10^{-4}$. The ultra-low expansion (ULE) glass mirror has two lane coatings, Pt and Pd, along with an uncoated lane. These coatings produce different energy cutoffs depending upon the lane selected. The mirror is positioned at a nominal 3.2 mrad angle. Using the glass, uncoated lane, a 50 percent intensity cutoff occurs near 8.5 keV. This is sufficient to reduce harmonic contamination to a negligible level at 6 keV as long as the beam is not heavily attenuated. For energies above 8.0 keV, the Pd lane is used.

For the Ti—Ni foil absorption measurements, beam shape at the sample was maintained at the tightest focus. Upstream of the focal point, the beam width is much larger, with dimensions of approximately 4.1-mm and 0.45-mm at BPM-1 and BPM-2, respectively. Each beam position monitor has its own type of foil holder. Ultra-thin foils installed in each beam position monitor are attached to a mounting ring, with the minimum opening diameter through each mounting ring 10 mm.

The source size at the monochromator is approximately 16 mm×2.5 mm. Minimum focused beam size is about 0.045 mm×0.028 mm (horizontal×vertical). Photon flux at 12.66 keV was $1.7\times10^{11}$ ph/sec.

Ti—Ni Foil Absorption
Measurement Detail

Previous protocols for carrying out absolute absorption measurements were designed to achieve adequate counting statistics and to ensure that the counting chain is linear and not subject to dead-time losses as a result of the use of a multi-channel analyzer. At the synchrotron, with comparatively little sample absorption, adequate energy resolution and relatively high photon flux, acquiring adequate counting statistics can be accomplished with relative ease. The instant method keeps errors due to counting statistics at less than 0.2 percent.

All detected photons in the Ti—Ni experiment resulted from mono-energetic Cr fluorescence, so no multi-channel analyzer was required.

Incident beam harmonics were not directly characterized inasmuch as ultra-thin Cr foil thicknesses were combined with the reduced absorption cross section at high energies. The inventors found that harmonics only become a problem when the fundamental beam energy is heavily attenuated, which was not the case in the instant invention.

To characterize the Ti—Ni ultra-thin foil, a series of absorption measurements were taken, covering a range from 6.1-13.4 keV. The Ti—Ni foil, inside BPM-1, was moved in and out of the beam by way of a pneumatic plunger built into the device. There is only a single stop so either the foil is in or completely out. BPM-2 was used as the intensity monitor by summing all four individual photodiodes and averaging the result into a single value. Each photodiode in BPM-2 maintained the same gain setting of $2\times10e8$ V/A at all energies. All electrometer offsets were zeroed at the start of the measurements.

The full beam from the monochromator was used for the measurement without being narrowed or restricted by any beam defining slits and no attenuation was used that might influence the level of harmonics in the beam. As a result, no intensity normalization was required other than to the APS ring current decay, which was provided by a monitor signal from the APS. X-ray current was maintained within about 2 mA during the measurements, as is typical during APS top-up mode. Slits near BPM-2 were opened wide, roughly 3×1 mm (H×V) and BPM-2 was re-centered on the beam prior to each measurement to account for small positional shifts with energy changes.

Because of the large separation distance between BPM-1 and BPM-2, there is no possibility for Bragg scattering to enter into the downstream detector. The upstream side of the BPM-2 photodiode holder is covered with lead, preventing any radiation from passing through onto the diodes from scatter sources upstream. Furthermore, with the beam unrestricted by slits, contamination by slit scatter was avoided. In addition, because these measurements are conducted in vacuum, beam expansion due to air scatter, which might otherwise cause additional background, is avoided.

After setting the energy, separate measurements were taken with the ultra-thin Ti—Ni foil in and out. Each measurement was performed for 5 seconds and 30 measurement points were taken for each position of the foil at each energy. Below the K-edge, data were recorded at eight energies between 6.1-8.25 keV. In the range just above the Ni K-edge, a scan of the edge was taken to determine peaks and valleys in the near-edge absorption profile. Several of these inflection points were used as target values. A total of 16 energy positions were recorded in the range of 8.344-9.006 keV. Beyond that, data were recorded at an additional 11 energies from 9.5-13.4 keV.

In order to fit the Ni mass absorption coefficients from the Ti—Ni data, the actual measurement energy should be known. As a general rule, the 19BM monochromator is very precise but accuracy varies depending upon the energy range of interest. The initial energy calibration is always performed at 12.66 keV using a Se metal foil. Reference spectra provided by EXAFS Materials (871 El Cerro Blvd., Danville, Calif. 94526, USA) have been compiled from measurements taken at several synchrotron beamlines. The tabulated edge energy (Bearden and Burr, 1967) is defined operationally as the first inflection point in the derivative spectrum. Energy calibration, therefore, results from comparing the reference spectra to the one collected at the beamline.

At the low energy end of the study, a Cr metal foil was used to check the calibration near 6 keV. Additional reference spectra were collected at the Mn, Fe, Co, Ni, and Zn edges. Results of these calibrations showed that the true (reference) energy was 4.4 eV higher than reported at 6.0 keV and 5.5 eV higher than reported at the Ni Kedge. Adjustments of 5 eV were incorporated into the XCOM mass absorption coefficients from 6.1-9.0 keV. At the Zn K-edge the energy is only 2 eV higher than recorded at the instrument. For this reason, no offsets were used for energies in the range of 10-13.4 keV.

Fitting Ni-Mass Absorption Coefficients
From Ti—Ni Absorption Data Detail

In order to fit the Ni mass absorption coefficients at all energies, the relative ultra-thin Ni thickness is first determined. This value will be used as the target in the fitting procedure. Calculating the relative Ni thickness requires measurements of at least two energies and coefficients for both Ni and Ti, plus a nominal Ni density. If the measurements are accurate, calculating the Ni thickness with any two energies will produce the same result, as long as the coefficients are correct.

Preferably, the relative Ni thickness calculation are based on measurement pairs that cross the K-edge boundary. Crossing the K-edge boundary increases the magnitude of the cross sections, thereby minimizing the impact of small errors inherent in the starting coefficients. Using the FFAST error guide to limit the Ni mass absorption cross sections to 1 percent error, the lower K-edge energies were limited to 6.1-8.0 keV and the upper energies from 10-13.4 keV. The measurement value taken just below the Ni K-edge (8.25 keV) was avoided just to ensure there were no unusual effects due to the closeness of the edge boundary.

By applying the XCOM mass absorption coefficients to Ti and Ni for these energies, it was possible to compute the relative ultra-thin Ni foil thickness using equation 1. All combinations were used. For example, each measurement at 6.1 keV is paired with all nine energies measured from 10.0-13.4. In total, 63 combinations are possible, yielding a Ni thickness of 0.6685±0.0073 µm; an error of 1.1 percent. The value for Ti was 0.977±0.010 µm. By comparison, calculations with energies on the same side of the K-edge boundary, using identical coefficients, produced thickness results that were essentially meaningless. These values were 1.45±1.3 µm (pre-edge, 6.1-8.0 keV, 21 permutations) and 0.81±2.7 µm (post-edge energies, 10.0-13.4 keV, 36 permutations).

In order to fit the Ni mass absorption coefficients based solely on the Ti—Ni absorption measurements, two assumptions were made in accordance with the assumed "best fit" error profiles. First, all Ti mass absorption coefficients used in the fit are derived from the XCOM database and fixed at those values during the fit. Second, the starting XCOM value for Ni was used for the energy at 13.4 keV. This energy is well into the 1 percent error profile.

This fitting procedure is designed to target the Ni coefficients above the K-edge. There were a large number of permutations possible above the K-edge, since there are 27 different measurement points above the edge, 26 of which will be fit. Starting at 13.0 keV, the fit between 13.0 and 13.4 keV was calculated by adjusting only the Ni coefficient at 13.0 keV (the Ni value for 13.4 has been fixed at the XCOM value for this energy). Following this, the 12.66 keV coefficient is fit using the 12.66-13.0 keV pair, and so on, working progressively to lower energy.

By fitting the energies that have the closest proximity to one another in order from high to low energy, all wider separation energy pairs were also fit. Results are presented in Table 1 along with the starting XCOM coefficients and the percentage differences. Before discussing the results of the fit coefficients, it will be useful to do an independent assessment of the fit precision by performing absorption measurements on a free-standing Ni foil (fs-Ni). In a modified transference method, the Ni fit coefficients are to be used to calculate the fs-Ni thickness. Independent measurements were made over many of the same energies as in the Ti—Ni experiment, so the thickness error is a reliable guide as to the precision of the fitting method.

Ni-Foil Measurement
Detail

A 4 mm diameter, free-standing i.e., unsupported, Ni foil (fs-Ni), 99.95 percent pure, nominally 8 µm thick, was purchased from Goodfellow Corporation (Goodfellow Corporation, 125 Hookstown Grade Road, Coraopolis, Pa. 15108-9302, USA). The fs-Ni is made from bulk material, not grown from a vapor deposition process, so the bulk density of 8.9 g/cm3 is appropriate.

The fs-Ni thickness was calculated using independent absorption measurements and the Ni fit coefficients presented in Table 1. The experimental setup was to mount the free-standing foil onto a flat surface pin using medium temperature vacuum grease. The foil was placed at the normal sample position, perpendicular to the beam, with the cold-stream removed. A nitrogen-filled ion chamber was moved into position approximately 230 mm downstream of the sample to detect the transmission signal. To focus the beam at the sample position after an energy change without removing the fs-Ni, a CdWO4 phosphor was mounted below the fs-Ni on the same pin. Beam focus was always set at the sample position (using the phosphor as a guide) and the 1-2 µm precision of the motor drives allowed the same spot on the sample to be positioned in the beam at every measurement energy.

As a secondary check, the sample contained a number of unique markings that were visible by the on-axis camera when the fs-Ni was aligned. These secondary markings were monitored during positioning of the sample and were not seen to be visibly out of alignment at any measurement point. By reproducibly positioning the fs-Ni to the same location for every measurement, the sample thickness remains constant throughout the experiment.

Because the fs-Ni is quite thin, ion chamber measurements were conducted using only two amplifier gain settings; 4×10e7 and 8×10e7 (V/A) and the electrometer offsets were re-adjusted for each setting. As with the Ti—Ni measurements, no attenuators were placed in the beam during the measurements. With the limited electrometer gain range, detector linearity was not an issue in the measurement. At each energy, 21 measurements were made for 10 sec each, at every foil position. The average value was computed from all points and normalized to the intensity monitor (BPM-2) signal to adjust for any changes in the X-ray ring current during the measurement.

Table 1 lists the fs-Ni thicknesses calculated from each measurement energy above the K-edge, using all fit coefficients plus the fixed XCOM coefficient used at 13.4 keV. Most, but not all of the Ti—Ni measurement energies were included in the fs-Ni measurements due to time constraints. The result is an average thickness of 7.722±0.055 μm, (±0.71 percent) as determined from all values.

With a reliable thickness for the free-standing foil, it is now possible to do a complete near-edge profile by scanning through the total near-edge energy range. To experimentally scan the energy, however, it is necessary to control the beam characteristics during the scan. To accomplish this, slits just upstream of BPM-2 were closed down to less than 100 μm in the horizontal direction to fix the beam size at the sample position, thus containing it to within the size of the unrestricted full beam focal spot during the scan. The vertical slits were opened to 1 mm. Multiple overlapping scans of 150 eV each were employed to cover the range from 8.25-9 keV. The last 50 eV of each scan was used to verify proper overlap and fitting between adjacent energy regions. Seven separate energy ranges were covered, with the focus reset at the start of each range. Each range required two identical energy scans, one for the foil in and one for the foil out because the same ion chamber is used for detection in both scans. Each measurement point was collected for 3 sec using the nitrogen-filled ion chamber. BPM-2 was used to normalize each ion chamber reading to the APS ring current on a point by point basis. Final absorption ratios were computed using the normalized ion chamber data. A continuous range of values is present at 1 eV step resolution with all the overlapping regions eliminated.

Table 1: All individual measurement energies are listed below, not including continuous scan data. Theoretical mass absorption coefficients for Ni and Ti as reported from the XCOM database are shown, along with the Ti—Ni fit coefficients derived for Ni above the K-edge. Experimental fs-Ni thicknesses were calculated using the Ti—Ni fit coefficients. Percentage differences, 100*(XCOM-fit/XCOM), are also reported between the XCOM Ni coefficients and the Ti—Ni fit coefficients for Ni.

Based on the standard deviation of fs-Ni data, mass absorption coefficient errors are estimated at ±0.71 percent.

TABLE 1

| Energy (keV) | XCOM Ni (cm²/g) | XCOM Ti (cm²/g) | Ti—Ni fit coefficients for Ni (cm²/g) | fs-Ni thickness (μm) | percent Diff |
|---|---|---|---|---|---|
| 6.1044 | 103.9 | 410.4 | | | |
| 6.5058 | 87.24 | 342.6 | | | |
| 6.5658 | 85.06 | 334.2 | | | |
| 7.0049 | 71.22 | 282.5 | | | |
| 7.5045 | 58.98 | 237.7 | | | |
| 7.734 | 54.31 | 220.5 | | | |
| 8.0045 | 49.45 | 202.1 | | | |
| 8.256 | 45.42 | 186.5 | | | |
| 8.3496 | 327.7 | 181 | 351.73 | 7.70 | 7.3 |
| 8.358 | 326.9 | 180.6 | 363.90 | 7.73 | 11.3 |
| 8.3695 | 325.7 | 179.9 | 333.60 | 7.73 | 2.4 |
| 8.3831 | 324.5 | 179.1 | 377.33 | 7.76 | 16.3 |
| 8.3943 | 323.4 | 178.5 | 333.66 | | 3.2 |
| 8.4035 | 322.5 | 178 | 330.04 | 7.78 | 2.3 |
| 8.434 | 319.7 | 176.3 | 377.14 | 7.74 | 18.0 |
| 8.4587 | 317.4 | 174.9 | 315.67 | 7.81 | −0.5 |
| 8.4994 | 313.7 | 172.7 | 374.55 | 7.72 | 19.4 |
| 8.5055 | 313.1 | 172.4 | 366.87 | | 17.2 |
| 8.5247 | 311.3 | 171.3 | 305.16 | 7.76 | −2.0 |
| 8.5437 | 309.6 | 170.3 | 338.20 | 7.70 | 9.2 |
| 8.5631 | 307.9 | 169.3 | 327.95 | 7.74 | 6.5 |
| 8.5841 | 306.1 | 168.2 | 350.11 | 7.70 | 14.4 |
| 8.672 | 298.4 | 163.7 | 326.22 | 7.73 | 9.3 |
| 9.0055 | 271.8 | 147.7 | 279.55 | 7.77 | 2.9 |
| 9.5021 | 237.8 | 127.5 | 242.42 | 7.73 | 1.9 |
| 9.669 | 227.6 | 121.5 | 231.64 | 7.70 | 1.8 |
| 10 | 209 | 110.7 | 210.64 | 7.74 | 0.8 |
| 10.5 | 184.3 | 96.69 | 184.25 | 7.73 | 0.0 |
| 11 | 163.3 | 85.01 | 163.62 | 7.69 | 0.2 |
| 11.5 | 145.2 | 75.17 | 147.33 | 7.57 | 1.5 |
| 12 | 129.7 | 66.81 | 128.38 | 7.79 | −1.0 |
| 12.5 | 116.2 | 59.66 | 116.09 | 7.66 | −0.1 |
| 12.66 | 112.3 | 57.59 | 110.89 | 7.81 | −1.3 |
| 13 | 104.5 | 53.51 | 106.05 | 7.60 | 1.5 |
| 13.4 | 96.28 | 49.18 | 96.28 | 7.68 | 0.0 |

Figure 2:
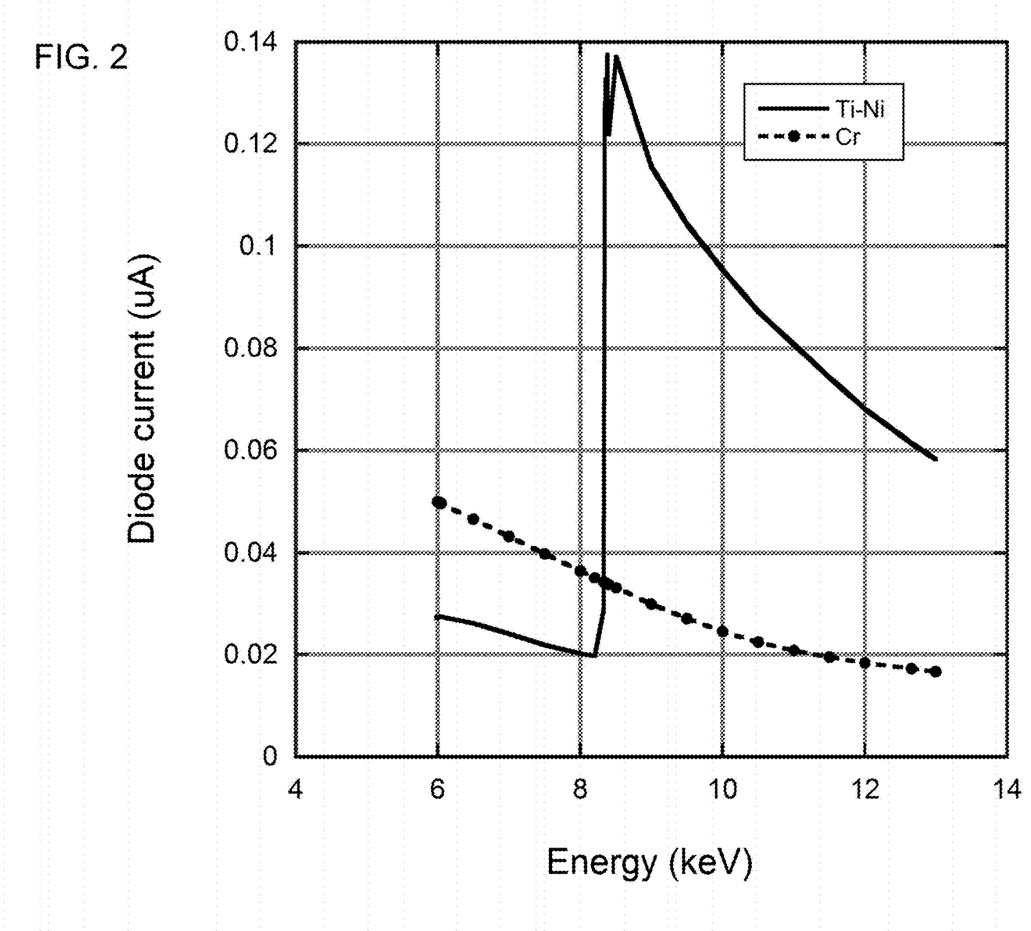
FIG. 2 is a graph showing photodiode current as a function of energy with separate foils, in accordance with features of the present invention.

FIG. 2 displays photodiode current generated by Ti—Ni fluorescence as a function of energy. Because the emission energy of Ti is lower than that of Cr, the output signal is reduced by about a factor of 2 below the Ni K-edge. Gain in signal above the Ni K-edge occurs because the emission energy from Ni is much higher than that given off by Cr. This increase in emission energy results in a factor of three or more gain in signal strength over the Cr signal. Photodiode intensity is proportional to the emission energy of the fluorescing metal, such that higher fluorescence energy creates a higher photodiode signal. The signal loss/gain combination serves to flatten out the electrometer gain requirements as a function of energy. As a result, only a single electrometer gain setting ($4 \times 10^7$V/A) is needed to monitor the incoming beam over the entire energy range of 6-13.5 keV. Although infrequently used, this setting should also be optimal for all energies below 6 keV.

The resulting bi-foil substrate produces electron gains of about 3 at energies ranging from about 8.3 KeV to about 13.4 KeV for the element Ni as compared to Cr. Gains will vary depending upon the bi-metal foil combinations used but are expected to be no less than a factor of 2.

Figure 3:
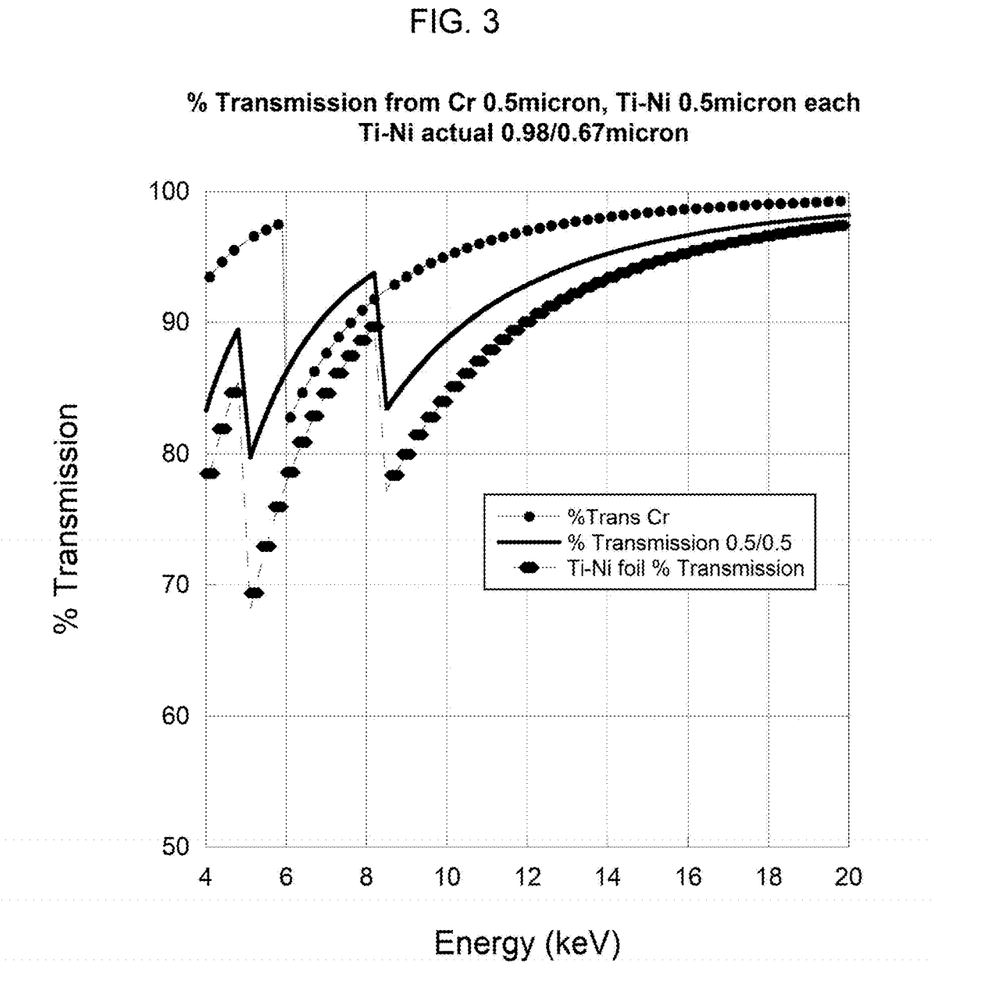
FIG. 3 is a graph comparing transmission values of Ti—Ni foil to Cr foil, in accordance with features of the present invention.

FIG. 3 is a graph showing the transmission characteristics of Ti—Ni foil compared to that of the Cr foil. The Cr foil had a thickness of 0.5 microns. Ti—Ni foils were plotted with matching 0.5 micron thicknesses and 0.98/0.67 micron thicknesses as measured.

Figure 4:
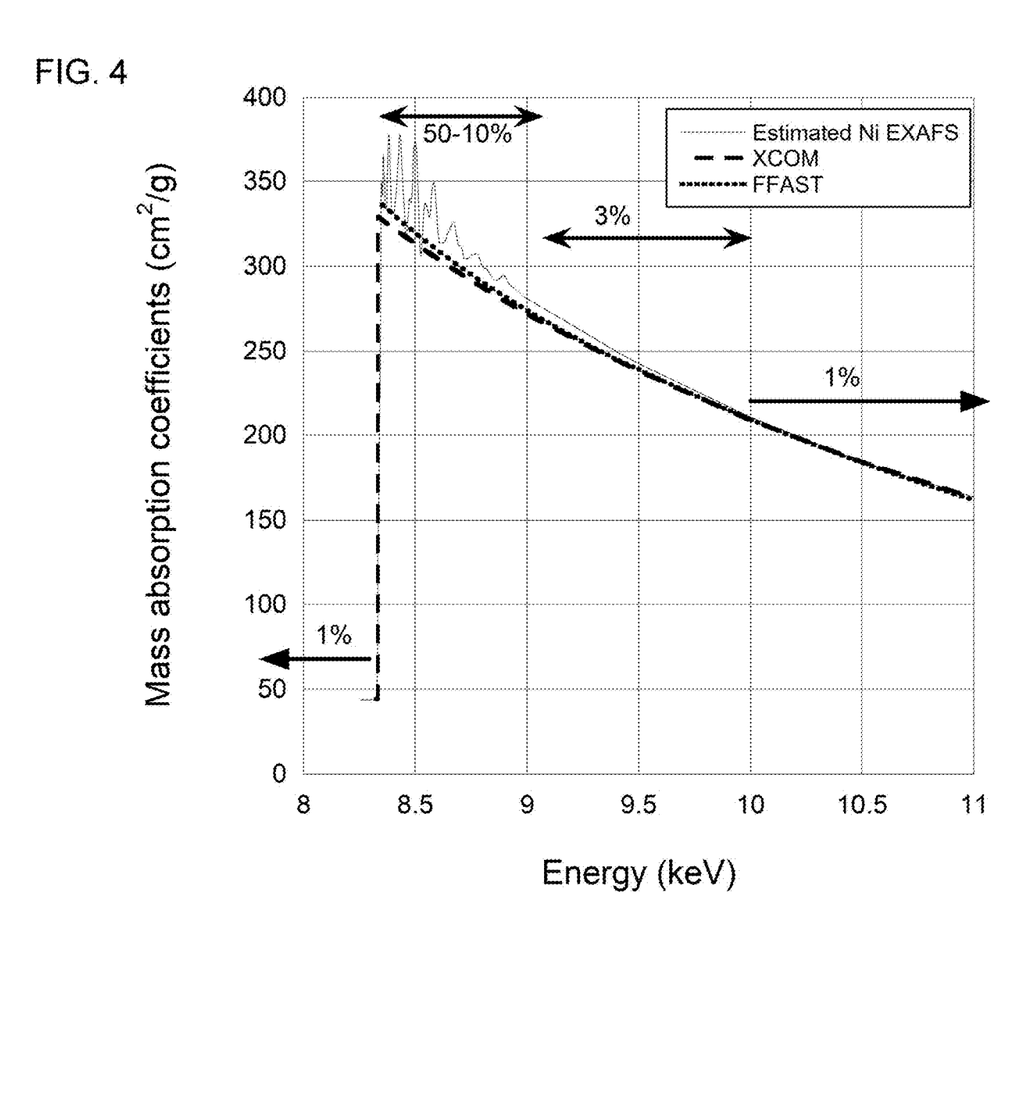
FIG. 4 is graph comparing the NIST XCOM and FFAST database coefficients and their associated error ranges with measured near-edge absorption data for nickel.

FIG. 4 is graph comparing the NIST XCOM and FFAST database coefficients and their associated error ranges with measured near-edge absorption data for nickel. (XCOM is a NIST controlled web program which aids in generating cross sections and attenuation coefficients for elements, compounds or mixtures, at energies between 1 keV and 100 GeV. FFAST is a NIST web program with the same functional purpose as the XCOM database except the two models used to generate their respective values are slightly different to accommodate to different target audiences. The FFAST database is more for crystallography and the XCOM database is targeted toward radiological physics and dosimetry.)

Existing NIST database values, from the NIST XCOM and FFAST databases, have errors ranging from 10-50 percent in the near edge region i.e., within a range of $E/E_{edge}$ equal to 1.001-1.10, due to lack of modelling capabilities in this near-edge region.

FIG. 4 shows clearly the NIST coefficients and how they do not match those derived using the described method.

In summary, a new method has been developed for determining the mass absorption coefficients of Ni, near the Ni K-edge. Using the invented ultra-thin Ti—Ni (bi-metal) foil, this method uses accurate absorption measurements at multiple energies combined with a reliance on existing data to fit Ni coefficients from the Ni K-edge to 13 keV. After fitting the mass absorption coefficients, a series of independent measurements were made on a free-standing Ni foil. Using the fit coefficients, the fs-Ni thickness was calculated, yielding a thickness error±0.71 percent, thereby validating the precision of the measurement. Comparing the fit coefficients to those of previous experimental work and to XCOM values estimated to be valid at the 1 percent error level, good agreement was found. Using measurements obtained on fs-Ni below the Ni K-edge, the XCOM database more closely matched the experimental evidence than did the FFAST database. In addition, the Example described herein shows a dip in the Ni mass absorption coefficient on close approach below the K-edge compared with the XCOM model.

Intensity Monitor
Detail

As noted supra, the bi-metal foil used in the beam position monitor also is adapted for use as an intensity monitor. This is done by monitoring one or more photodiode signals or by monitoring the summation of all photodiode signals without the need to determine beam position.

Beam intensity monitors need not be part of a photodiode beam position monitor as many different types of detectors can be used to record fluorescence intensity e.g., Si(Li), NaI(Tl), and Cd(Tl), etc. One of the difficulties in monitoring beam intensity in prior art systems is that beam defining slits reduce the overall number of photons onto the fluorescing metal foil, thus decreasing the intensity recorded by the fluorescence detector. In addition, the beam defining slits also make it impossible to accurately define the beam position since the beam position is fixed by the slit location. The increased cross section at high energy combined with the higher emission energy of the invented bimetal foil provides greater intensity at both higher energy and with reduced slit size, thus making it easier to monitor beam intensity after beam defining slits.

There are a myriad of ways to monitor beam intensity. Pursuant to one method, the beam is received by a photodiode which converts the beam to a current. The current is further processed by a pre-amplifier and an electrometer to determine what frequencies are represented by the current. The frequency data is then passed to a scaler. This can be done continuously or on a single read basis.

Another method comprises reading multiple individual channels in the same manner and computing a summation from the individual channels. The detector signal (whether photodiode current or solid state detector) is analyzed via appropriate signal processing techniques to convert the input signal into a digital record. This is done on a per unit basis, where this typically refers to a unit of time e.g. photons per sampling interval. With multiple detectors, all signals are summed or averaged together and a single reading is output based on a time increment. A computer program interrogates the relevant equipment in order to arrive at the appropriate numerical value.

Energy Calibration
Device Detail

Also as noted supra, because the absorption edge energies are known, the bimetal foil can also be used as an energy calibration device.

Beamline monochromators are typically calibrated using the absorption edge from an individual metal foil near the energy range of interest. While a monochromator calibration is valid near an absorption edge, movement away from the calibration point is not precise enough to allow the calibration to be maintained at all working energies due to the variabilities of the mechanical drive used in the rotation stage that performs monochromator energy changes. For this reason multiple calibrations are needed depending upon the reproducibility of the monochromator drive. Performing a calibration usually requires entry into an experimental hutch to manually place a metal foil into the beam so that an absorption measurement can take place.

By scanning the beamline energy across the energy range defined by the absorption edge of a single metal foil, the absorption edge profile can be used as a reference for the beamline energy. With a bi-metal foil, each first and second metal will provide characteristic calibration points relative to each metal's absorption edge profile e.g., K, L1, L2, L3 etc.

Calibration points from a bimetal foil will allow multiple calibration points over a wide energy range instead of just those from a single metal foil. In addition, because the bimetal foil is positioned in a device that is part of the beamline, it will always be available to the end-user, thus alleviating any manual entry into the experimental hutch and allowing the calibration process to be performed by remote operation.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. While the dimensions and types of materials described herein are intended to define the parameters of the invention, they are by no means limiting, but are instead exemplary embodiments.

Many other embodiments will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the terms "comprising" and "wherein." Moreover, in the following claims, the terms "first," "second," and "third," are used merely as labels, and are not intended to impose numerical requirements on their objects. Further, the limitations of the following claims are not written in means-plus-function format and are not intended to be interpreted based on 35 U.S.C. § 112, sixth paragraph, unless and until such claim limitations expressly use the phrase "means for" followed by a statement of function void of further structure.

As will be understood by one skilled in the art, for any and all purposes, particularly in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," "greater than," "less than," "more than" and the like include the number recited and refer to ranges which can be subsequently broken down into subranges as discussed above. In the same manner, all ratios disclosed herein also include all subratios falling within the broader ratio.

One skilled in the art will also readily recognize that where members are grouped together in a common manner, such as in a Markush group, the present invention encompasses not only the entire group listed as a whole, but each member of the group individually and all possible subgroups of the main group. Accordingly, for all purposes, the present invention encompasses not only the main group, but also the main group absent one or more of the group members. The present invention also envisages the explicit exclusion of one or more of any of the group members in the claimed invention.

The embodiment of the invention in which an exclusive property or privilege is claimed is defined as follows:

1. A method for determining mass absorption coefficients, the method comprising:
   a) measuring the absorption of an incident radiation beam by a first metal and a second metal as a function of a first energy and a second energy, wherein the first metal and second metal comprise an upstream bi-metal foil;
   b) calculating the relative first metal thickness;
   c) using the relative thickness of the first metal foil as a target value to fit the mass absorption coefficients for the first metal foil based on absorption measurements performed at multiple energies across the first metal foil's absorption edge boundary;
   d) perform repeat steps a-c on a free standing downstream single metal foil which is positioned downstream of the upstream bi-metal foil;
   e) using the free standing downstream single metal foil absorption measurements, bulk first metal density and bimetal foil fit coefficients to determine the free standing downstream single metal foil thickness;
   f) using the free standing downstream single metal foil to conduct a high resolution scan from just below one of its absorption edges and extending 1 or more keV above the absorption edge; and
   g) using the downstream single metal foil absorption measurements and predetermined thickness to compute mass absorption coefficients below its absorption edge.

2. The method as recited in claim 1 wherein the step of calculating the thickness for each metal comprises:
   a) measuring absorption of the bi-metal foil at multiple energies wherein the energy range is determined so that measurements relative to the first metal foil will span above and below an absorption edge boundary;
   b) determining the component thickness of the first metal and the second metal using the relative bi-metal foil densities of the first metal and the second metal and known NIST mass absorption cross sections with errors at the 1 percent level for the upstream bimetal foil within these ranges; and
   c) using the relative bi-metal component thicknesses and NIST 1 percent error coefficients for the second metal of the upstream bimetal foil to fit the mass absorption coefficients for the first metal foil at all measured energies above the absorption edge.

3. The method as recited in claim 1 wherein the radiation is X-ray radiation at an energy from about 2 keV to about 100 keV.

4. The method as recited in claim 1 wherein the first metal is downstream of the second metal.

5. The method as recited in claim 1 wherein the first foil is a $1^{st}$ or $2^{nd}$ row transition metal group of the Periodic Table, selected from the group consisting of Ni, Co, Cu, Zn, Mo, Rh, Pd, Ag, and combinations thereof.

6. The method as recited in claim 1 wherein the second foil is a $1^{st}$ or $2^{nd}$ row transition metals group of the Periodic Table, selected from the group consisting of Ti, Cr, Fe, Co, Ni Cu, Zn, Mo, Rh, Pd, Ag and combinations thereof.

7. The method as recited in claim 1 wherein the first foil is a 3rd row transition metal group of the Periodic Table selected from the group consisting of Ta, W, Ir, Pt, Au, and combinations thereof.

8. The method as recited in claim 1 wherein the substrate exhibits an electron gain of no less than a factor of 2 relative to photodiode current generated using Cr metal fluorescence.

9. The method as recited in claim 1 wherein the thicknesses of the first and second foils independently range from approximately 0.2-2.5 microns each, with the total thickness of the bimetal foil ranging from approximately 0.4 to approximately 5.0 microns.

\* \* \* \* \*